United States Patent
Yokota et al.

(10) Patent No.: US 9,224,744 B1
(45) Date of Patent: Dec. 29, 2015

(54) WIDE AND NARROW PATTERNING USING COMMON PROCESS

(71) Applicant: SanDisk Technologies Inc., Plano, TX (US)

(72) Inventors: Toshiya Yokota, Mie (JP); Chia-Lin Hsiung, San Jose, CA (US); Fumiaki Toyama, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/475,780

(22) Filed: Sep. 3, 2014

(51) Int. Cl.
*H01L 21/302* (2006.01)
*H01L 27/115* (2006.01)
*H01L 23/528* (2006.01)
*H01L 21/311* (2006.01)
*H01L 21/768* (2006.01)
*H01L 21/033* (2006.01)

(52) U.S. Cl.
CPC ...... *H01L 27/11529* (2013.01); *H01L 21/0337* (2013.01); *H01L 21/0338* (2013.01); *H01L 21/31144* (2013.01); *H01L 21/76802* (2013.01); *H01L 21/76816* (2013.01); *H01L 21/76877* (2013.01); *H01L 23/528* (2013.01)

(58) Field of Classification Search
CPC ............ H01L 21/0337; H01L 21/0338; H01L 21/76877; H01L 21/76816; H01L 21/76802; H01L 27/31144; H01L 27/11526
USPC .................................................. 438/267, 424
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,887,145 A | 3/1999 | Harari et al. | |
| 6,011,725 A | 1/2000 | Eitan | |
| 6,046,935 A | 4/2000 | Takeuchi et al. | |
| 6,429,123 B1 | 8/2002 | Tseng | |
| 7,291,560 B2 | 11/2007 | Parascandola et al. | |
| 7,951,669 B2 | 5/2011 | Harari et al. | |
| 8,003,482 B2* | 8/2011 | Brown | G03F 9/708 257/E21.214 |
| 8,216,947 B2* | 7/2012 | Lee | H01L 21/0332 438/267 |
| 8,247,291 B2* | 8/2012 | Min | H01L 21/0337 257/E21.538 |
| 8,310,055 B2* | 11/2012 | Park | H01L 21/0337 257/734 |
| 8,557,704 B2 | 10/2013 | Wells et al. | |
| 8,686,563 B2* | 4/2014 | Park | H01L 21/0337 257/773 |
| 8,937,011 B2* | 1/2015 | Iuchi | H01L 21/76837 257/E21.585 |
| 8,969,206 B1* | 3/2015 | Sel | H01L 21/32139 216/46 |
| 2006/0216938 A1 | 9/2006 | Miyagawa et al. | |
| 2006/0234166 A1 | 10/2006 | Lee et al. | |
| 2007/0026684 A1 | 2/2007 | Parascandola et al. | |

(Continued)

OTHER PUBLICATIONS

Chen et al., "Self-Aligned Triple Patterning to Extend Optical Lithography for 1x Patterning," International Symposium on Lithography Extensions, Oct. 21, 2010, 20 pages.

(Continued)

*Primary Examiner* — Savitr Mulpuri
(74) *Attorney, Agent, or Firm* — Davis Wright Tremaine LLP

(57) ABSTRACT

A NAND flash memory chip includes narrow word lines that are directly patterned from sidewall spacers and larger structures that are patterned from sidewall spacers with covering material. Sidewall spacers with covering material define wider features than sidewalls alone. Closely spaced sidewalls with covering material define large structures such as contact pads and select lines.

11 Claims, 11 Drawing Sheets

(56) References Cited

U.S. PATENT DOCUMENTS

| | | |
|---|---|---|
| 2008/0131793 A1 | 6/2008 | Lee et al. |
| 2009/0263749 A1* | 10/2009 | Sim ............... H01L 21/0337 430/319 |
| 2010/0096719 A1* | 4/2010 | Lee ............... H01L 21/0332 257/506 |
| 2010/0120247 A1 | 5/2010 | Park |
| 2011/0104899 A1 | 5/2011 | Lam et al. |
| 2012/0085733 A1 | 4/2012 | Mebarki et al. |
| 2013/0065397 A1 | 3/2013 | Chen |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

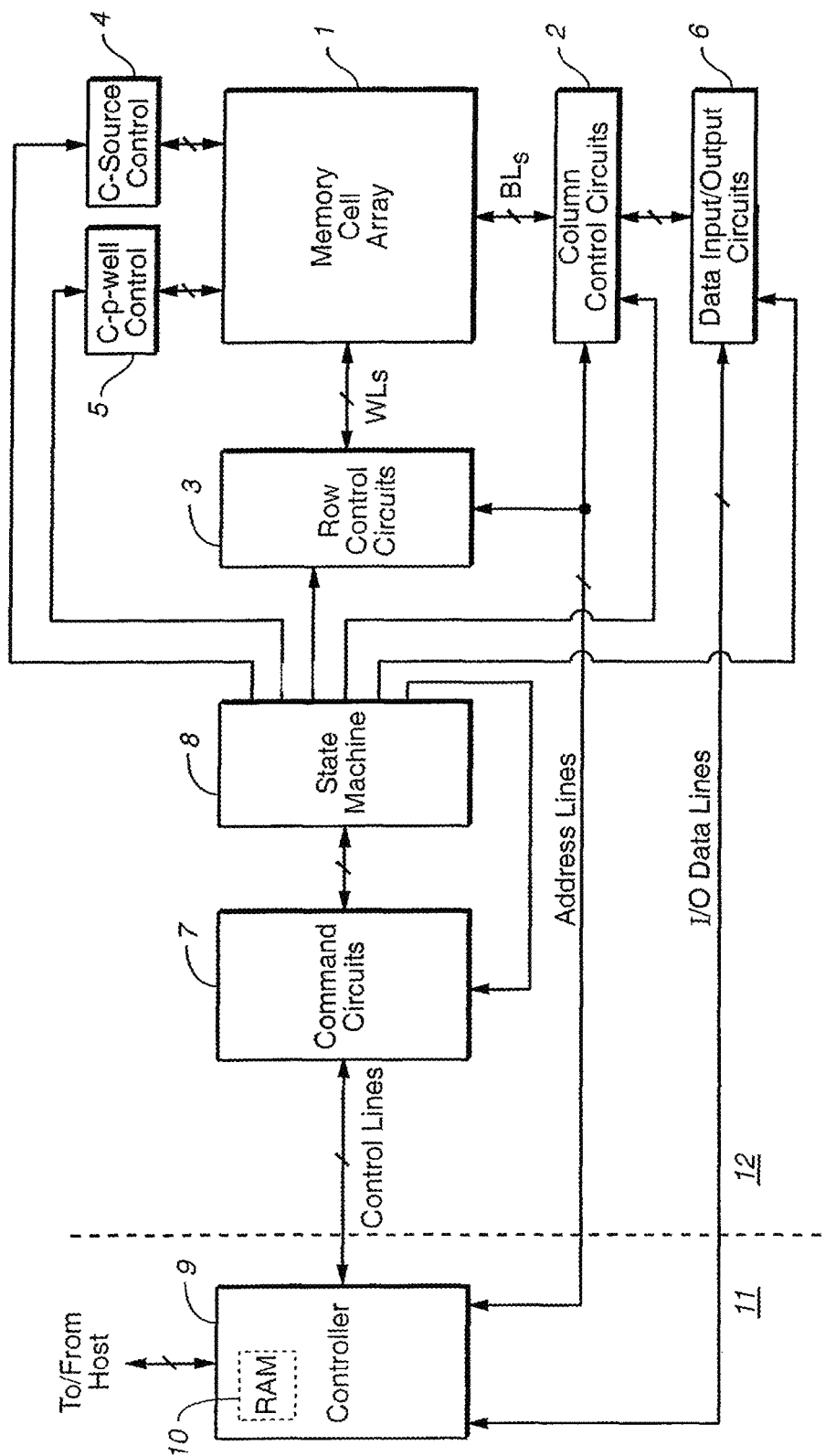
FIG._1 (Prior Art)

WIDE AND NARROW PATTERNING USING COMMON PROCESS

BACKGROUND

This application relates generally to non-volatile semiconductor memories of the flash memory type, their formation, structure and use, and specifically to methods of making conductive lines and other features in NAND memories.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

FIG. 2B is a circuit diagram for a portion of a NAND flash memory array such as shown in FIG. 2A. It can be seen that drain select line DSL controls select transistors at one end of NAND strings which connect to bit lines while source select line SSL controls the other end of NAND strings which connect to a common source line. It can be seen that select transistors have different functions and different structures to memory cells (e.g. select transistors have no floating gates). However, it is generally not desirable to use a different set of process steps for formation of select transistors and memory cells.

Connections to word lines may be made by forming contact pads at the ends of word lines which can later be connected through vertical vias. While contact pads are relatively large scale structures (compared with word lines) it is generally desirable to form contact pads and word lines using common process steps. Other structures in peripheral areas may also be relatively large compared with word lines. It is generally desirable to use common process steps for forming any such structures where possible to reduce cost and complexity.

Thus, there is a need for a memory chip manufacturing process that forms very small features in a memory array and also forms larger structures including select transistors and contact pads in an efficient manner and there is a need for structures that can be formed accordingly.

SUMMARY

According to an example, a covering material is added to certain portions of a mask pattern with small features (such as a mask formed of sidewall spacers) to selectively expand some of the mask features. Elongated masking portions that define conductive lines may be expanded to make the masking portions physically stronger and to make resulting conductive lines wider and therefore less resistive. An arrangement of closely spaced masking portions may be joined together by covering material to define large structures such as contact pads or select lines. Thus, a common pattern with small dimensions (e.g. sidewall spacers) may define both small features such as word lines and large features such as contact pads, select lines, peripheral transistors and other features.

An example of a method of forming a NAND flash memory includes: forming a plurality of elongated masking portions extending across an array area and a peripheral area of a memory die; subsequently depositing a covering material on the plurality of elongated masking portions; subsequently etching back the covering material; subsequently forming a protective portion over the plurality of elongated masking portions with covering material in the peripheral area while leaving elongated masking portions with covering material exposed in the array area; subsequently removing exposed covering material from the array area while the protective portion protects covering material in the peripheral area; subsequently removing the protective portion; and subsequently performing a patterning step using a pattern formed by the plurality of elongated masking portions without covering material in the array area and formed by the plurality of elongated masking portions with covering material in the peripheral area.

The elongated masking portions with covering material in the peripheral area may define a contact pad. The elongated masking portions with covering material in the peripheral area may define one or more conductive lines that connect contact pads with word lines. The elongated masking portions without covering material in the array area may define word lines. A word line may have a first width, and a conductive line may have a second width that is greater than the first width. The elongated masking portions with covering material in the peripheral area may define at least one dimension of a peripheral transistor. Forming the plurality of elongated masking portions may include: forming a plurality of elongated mandrels by photolithographic patterning; subsequently narrowing the plurality of elongated mandrels; and subsequently forming the plurality of elongated masking portions as sidewalls along sides of the plurality of elongated mandrels. Covering material may include at least one of: silicon dioxide (SiO2), silicon nitride (SiN), silicon oxy-nitride (SiON), silicon carbon nitride (SiCN), silicon oxy-carbide (SiOC), boron silicate glass (BSG), phosphorous silicate glass (PSG), boron phosphorous silicate glass (BPSG), and amorphous carbon (a-C), aluminum oxide (Al2O3). An additional protective portion may be formed in the array area to protect covering material in a portion of the array area that defines one or more select transistors.

An example of a NAND memory die includes: a plurality of word lines that have a first width that is less than a minimum feature size of a photolithographic patterning process used to pattern the die, the first width established by a sidewall; and a plurality of conductive lines that connect the plurality of word lines to contact pads, an individual conductive line having a second width that is greater than the first width, the second width established by sidewalls having the first width that have a covering material along sides to provide a covered sidewall structure that has the second width.

The NAND memory die may also include: a plurality of select lines that have a third width that is greater than the first width and the second width, the third width established by a plurality of substantially contiguous covered sidewall structures. The NAND memory die may also include a plurality of contact pads, an individual contact pad having lateral dimensions that are greater than the first width and the second width, the lateral dimensions established by a plurality of substantially contiguous covered sidewall structures. The NAND memory die may also include a plurality of peripheral transistors, at least one dimension of a peripheral transistor established by a plurality of substantially contiguous covered sidewall structures. The first width of the plurality of word lines may be established by sidewalls having the first width.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.

DETAILED DESCRIPTION OF EXEMPLARY EMBODIMENTS

Memory System

Figure 2A:
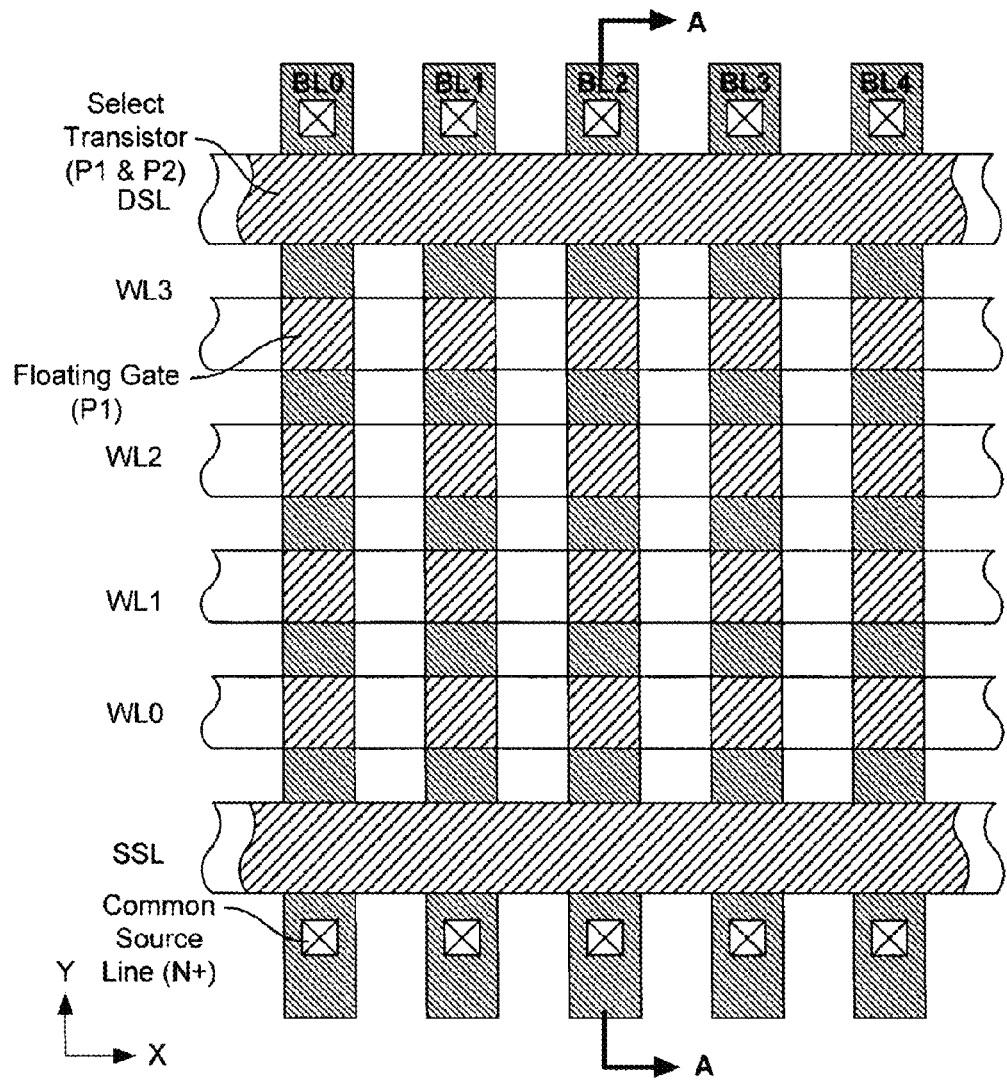
FIG. 2A is a plan view of a prior art NAND array.
Figure 2B:
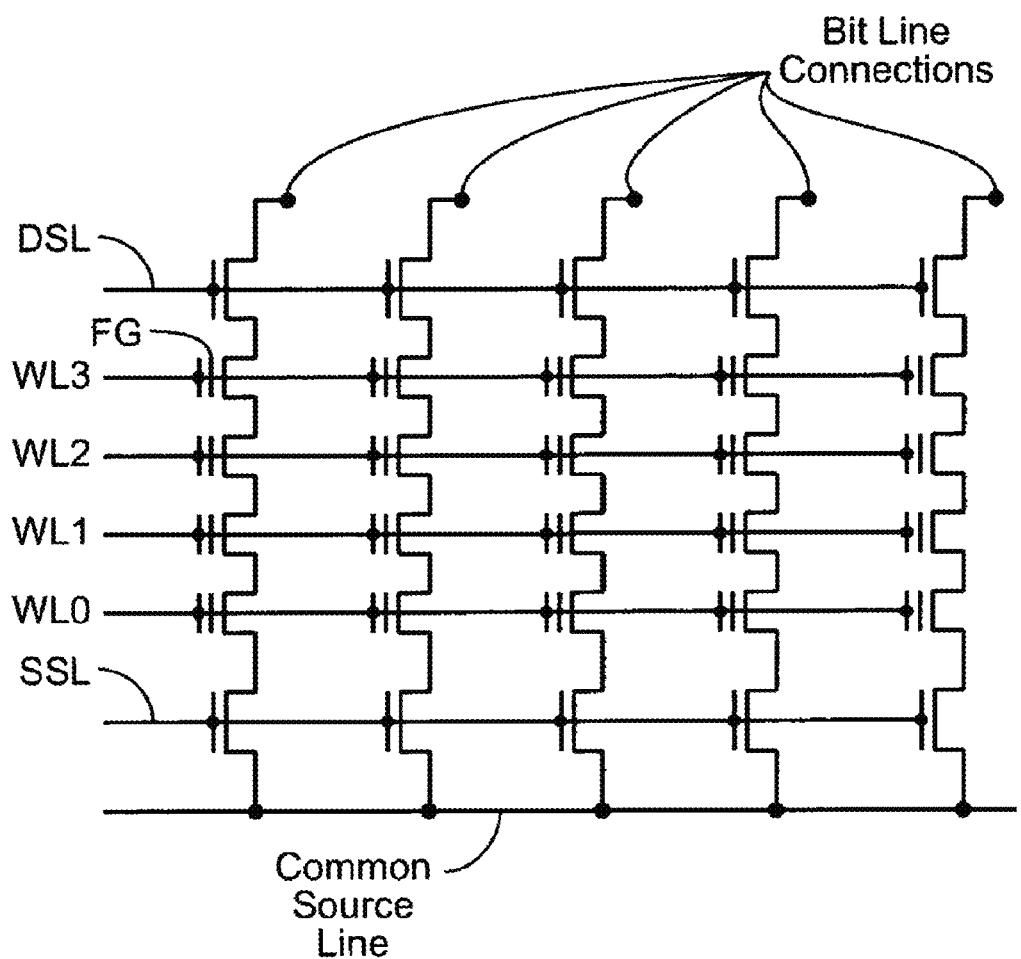
FIG. 2B is a circuit diagram for the prior art NAND array of FIG. 2A.

An example of a prior art memory system, which may be modified to include various techniques described here, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device.

A typical prior art NAND array includes control gate (word) lines extending across multiple strings over rows of floating gates with a suitable insulating dielectric layer in between. One control gate (word) line is used for each row of floating gates. In order to make an array with the floating and control gates self-aligned in a y-direction (along the lengths of the NAND strings), the same mask is generally used to form the control gates and to form the floating gates, which then have the same dimensions in the y-direction as the control gates. A single etch step may be used to form such control gate/floating gate stacks and to also define select gates.

In some designs, word lines may be formed by etching using a hard mask that is patterned to have critical dimensions that are less than the resolution of the lithographic process used. In particular, sidewalls may be formed with very small lateral dimensions and these sidewalls are then used as mask portions to define word lines and underlying floating gates in what may be referred to as a double patterning process. Because such sidewalls are formed around the perimeter of forming structures (mandrels), they are formed as closed loops. Such closed loops may be used to define two word lines and to at least partially define contact pads that allow word lines to be connected to driver circuits.

Figure 3:
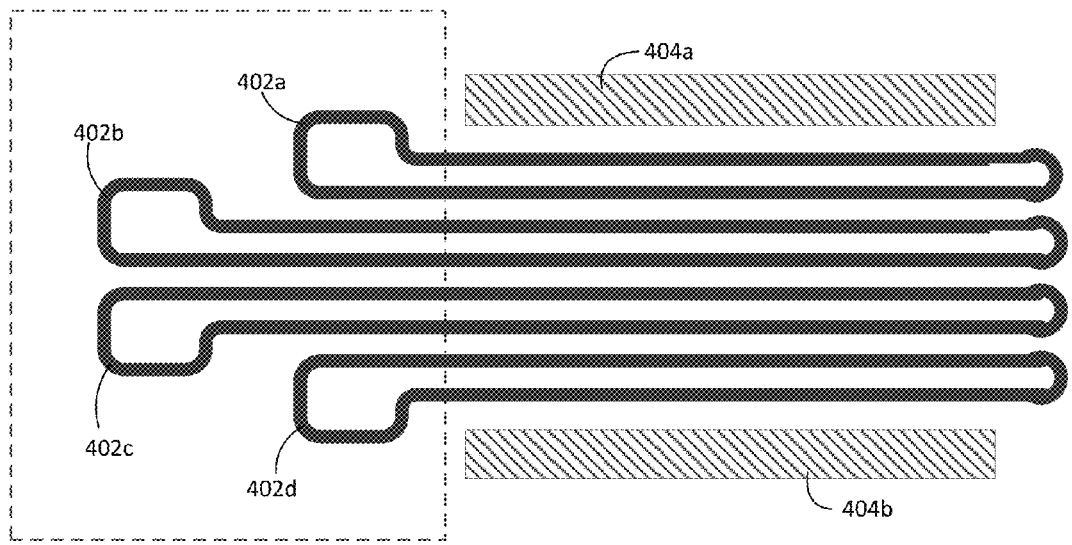
FIG. 3 illustrates an example of a pattern for forming a NAND memory.

FIG. 3 shows a parallel loop design at an intermediate stage of fabrication where multiple loops 402a-402d of conductive material have been formed using a mask pattern defined by sidewalls that were formed around mandrels. Strips of conductive material are also formed above and below the series of loops to form select lines 404a, 404b. Subsequently, an etch step is performed to remove portions of the conductive material so that each loop is divided into two word lines.

Figure 4:
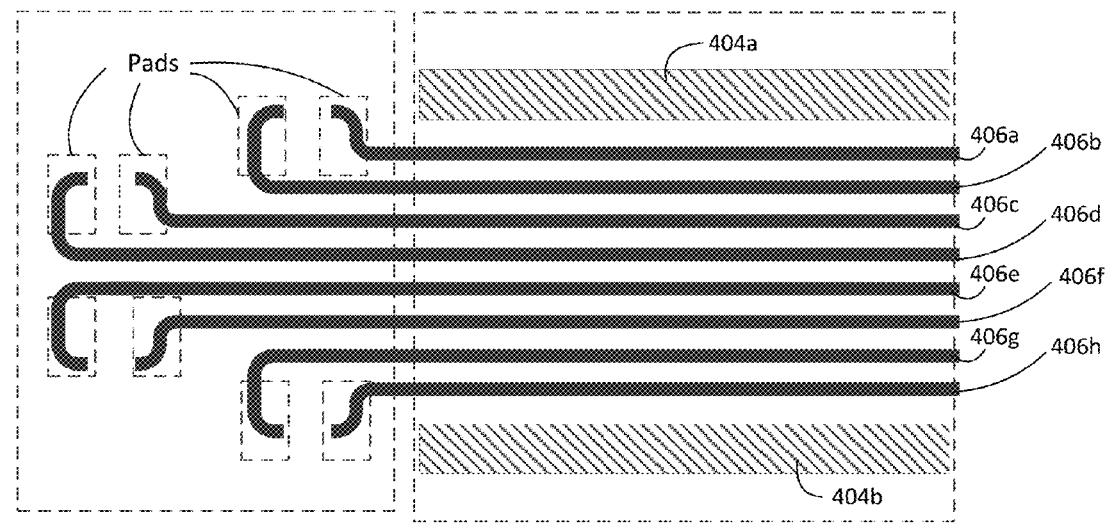
FIG. 4 illustrates an example of a pattern for forming separate word lines, select lines, and contact pads.

The result of the etching step is shown in FIG. 4 which shows a series of word lines 406a-406h extending laterally between select lines 404a, 404b in an array area, and with word lines connecting to contact pads in a peripheral area so that there is adequate space to provide pads for vertical connection to the word lines at locations shown by dashed lines. NAND strings extend between select lines 404a and 404b and are defined by Shallow Trench Isolation (STI) structures that are formed in the substrate (not shown in FIGS. 4A-4B for clarity).

It can be seen that select gates and contact pads have larger dimensions than word lines. While word lines may be formed by a double-patterning scheme to reduce word line widths below the minimum feature size achievable using direct patterning, such double-patterning may not be convenient for forming relatively larger dimensions of select lines and contact pads. Some additional patterning may be needed in order to form select lines and contact pads.

Figure 5:
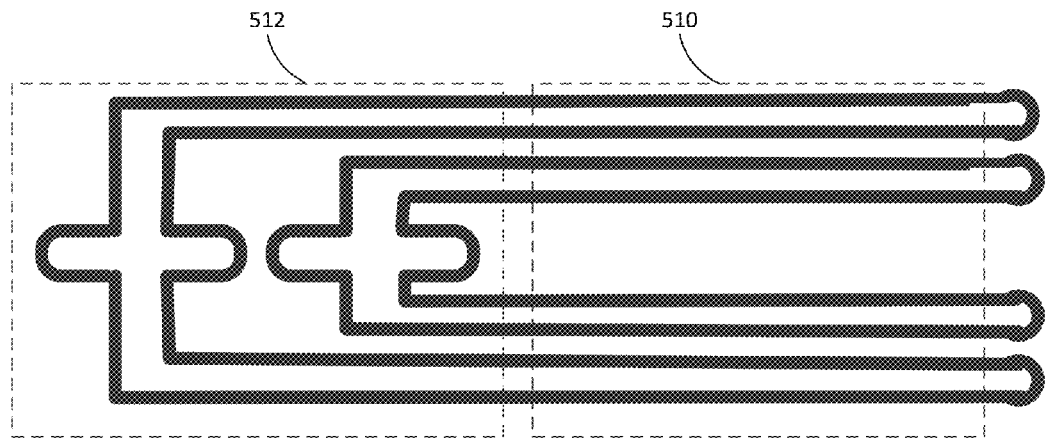
FIG. 5 shows another example of a pattern for forming a NAND memory.

FIG. 5 shows a simplified example of a pattern for formation of word lines and contact pads (with a reduced number of word lines for clearer illustration). A memory array area 510 includes word lines that are closely spaced (spacing between word lines may be equal to word line width and may be less than the minimum feature size achievable with direct patterning). A peripheral 512 area includes areas where contact pads are to be formed for connection to the word lines. It can be seen in this arrangement and in the arrangement of FIG. 4 that conductive lines become more spread out in the peripheral area. While a range of different patterns may be used to form word lines and contact pads, in many cases conductive lines that connect between the memory array area (where memory cells are formed) and contact pads are more widely spaced than in the memory array area.

Figure 6:
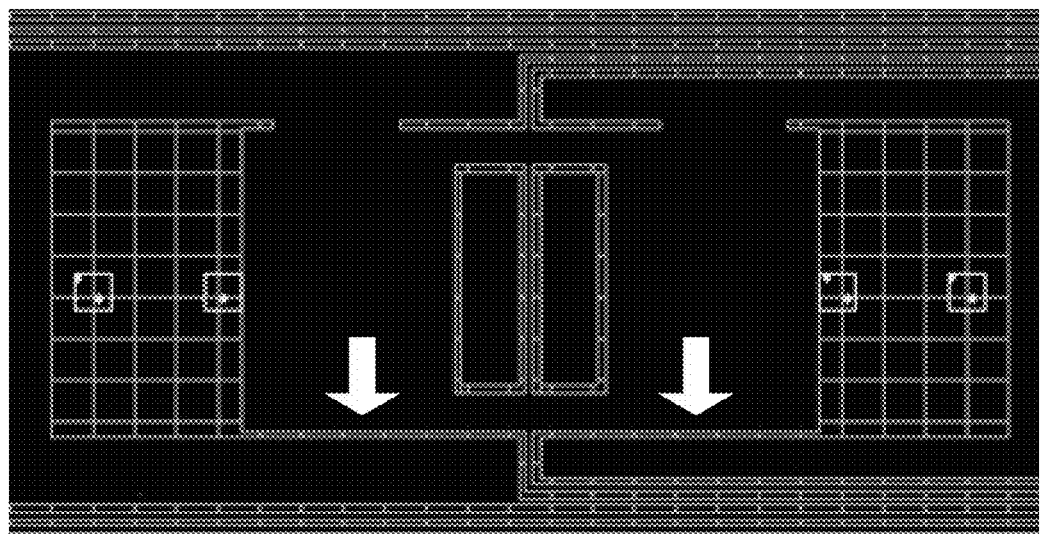
FIG. 6 shows a detailed view of a portion of a memory where conductive lines connect to a contact pads.

FIG. 6 shows another example of conductive lines in a peripheral area that connect between the word lines in the memory array area and the contact pads. It can be seen that the conductive lines are relatively isolated as they approach the contact pads (e.g. at locations shown by arrows).

One problem that may occur when a small element such as a sidewall spacer (or line formed from such a sidewall spacer) is isolated is that it is more likely to be physically damaged during processing because of its increased exposure to physical forces such as may be experienced during etching, cleaning, or other process steps.

Figure 7:
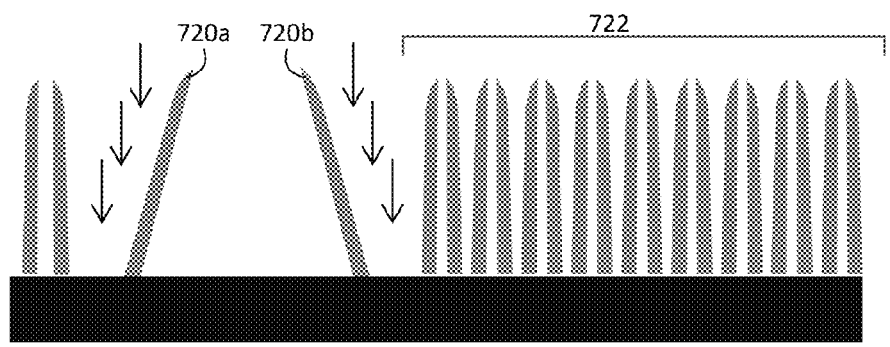
FIG. 7 shows an example of how isolated masking portions may be damaged.

FIG. 7 shows an example of two isolated sidewall spacers 720a-b (as may be found in a peripheral area) and a group of closely spaced sidewall spacers 722 (as may be found in a memory array area). During etching or other process steps (e.g. cleaning, etc.) isolated sidewalls are more exposed than closely spaced sidewalls. As a result, forces (indicated by arrows) on isolated sidewall spacers may be greater than on closely spaced sidewall spacers 722 so that such isolated sidewall spacers are more likely to become deformed and to cause physical defects in resulting integrated circuits. Even if sidewall spacers are not significantly affected by process steps the resulting isolated conductors may be vulnerable to damage during subsequent processing.

Covering Isolated Masking Portions

Examples described here provide isolated structures that have improved physical strength compared with the isolated structures of FIG. 7. In particular, such isolated structures may have a covering material deposited so that the covering material overlies the isolated structures and provides protection and physical support during subsequent processing. The covering material may remain in place during subsequent patterning so that wider features are formed (i.e. a given structure with covering material is wider than the same structure without the covering material). For conductive lines, increased width means that the cross sectional area is increased and therefore the resistance is lower. The covering material may be removed from the memory array so that patterning in the memory array is unaffected (i.e. word line width in the memory array remains extremely small).

Figure 8:
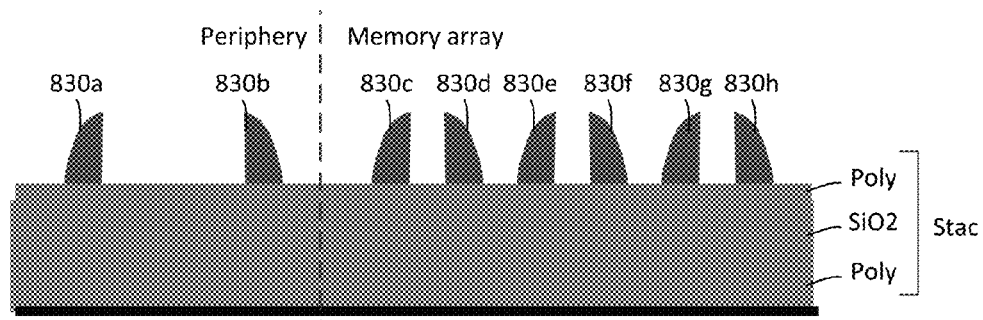
FIG. 8 shows a cross section of a memory at an intermediate stage of fabrication.

FIG. 8 shows an example cross section of a memory at an intermediate stage of fabrication with elongated masking portions 830a-h (sidewalls in this example) on a stack of blanket layers of different materials that are to be patterned (layers of polysilicon and silicon dioxide in this example). Elongated masking portions are closely spaced in the array area and more isolated in the peripheral area. The elongated masking portions may be formed by a double patterning process (e.g. forming mandrels by photolithographic patterning, slimming mandrels, forming sidewall spacers, and removing mandrels). However, rather than use the elongated masking portions to directly pattern the underlying stack, a covering material is deposited at this point.

Figure 9:
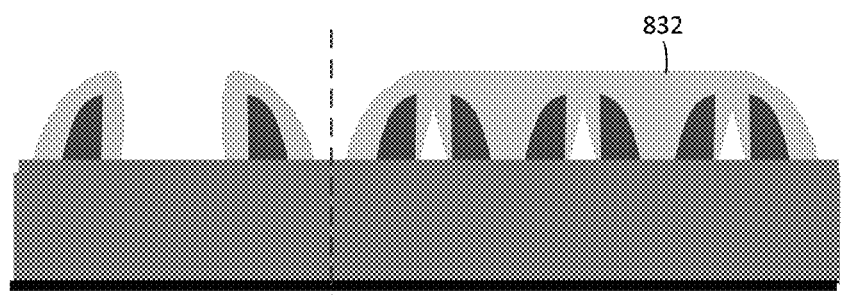
FIG. 9 shows the structure of FIG. 8 after formation of a layer of covering material.

FIG. 9 shows the memory of FIG. 8 after deposition and etch back of a covering material 832. The covering material may be any suitable material that can be selectively removed from over the elongated masking portions and the underlying stack. Thus, the choice of covering material depends on what materials the elongated masking portions and the underlying layers are formed of. A variety of materials are possible including boron doped silicon oxide (BSG), polysilicon, silicon dioxide, silicon nitride, and CVD carbon. The covering material 832 is etched back so that it is substantially removed from the field in the peripheral area (e.g. using anisotropic etching such as RIE) while remaining over masking portions 830a-h.

Figure 10:
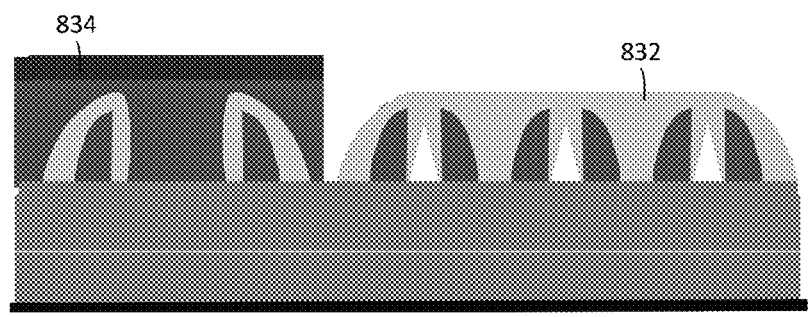
FIG. 10 shows the structure of FIG. 9 with masking of some areas.

FIG. 10 shows the memory of FIG. 9 after formation of a resist layer 834 and lithographic patterning of the resist layer so that the peripheral area is covered while the memory array is exposed. Subsequently, a selective etch may be used to remove the exposed covering material in the memory array area while the covering material in the peripheral area remains unetched because it is protected by resist.

Figure 11:
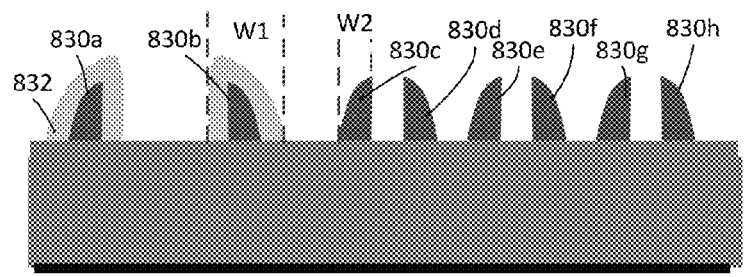
FIG. 11 shows the structure of FIG. 10 after removal of covering material from the memory array area.

FIG. 11 shows the memory of FIG. 10 after selective etching of the covering material in the memory array area and subsequent removal of the resist that covered the peripheral area. The result is that the masking portions in the memory array area 830c-h are as in FIG. 8, without covering material, while the masking portions in the peripheral area 830a-b have covering material 832 extending along their sides that makes them thicker. The covering material provides increased width W1 compared with uncovered masking portions W2 and may provide increased physical strength so that collapse or deformation is less likely.

Figure 12:
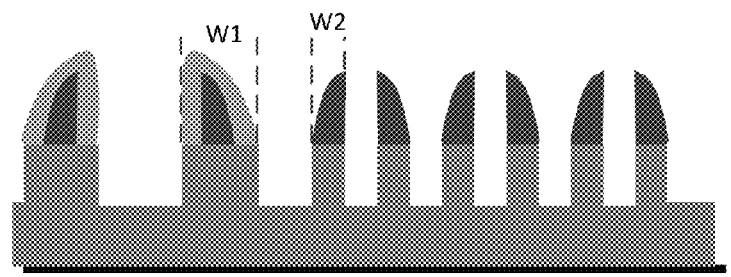
FIG. 12 shows the structure of FIG. 11 after pattern transfer.

FIG. 12 shows the structure of FIG. 11 after anisotropic etching (e.g. RIE) to transfer the pattern of the masking portions to the underlying layer, or layers. It will be understood that, once a masking pattern is established, the pattern may be transferred to multiple underlying layers using a single etch step, or a series of different etch steps. It will also be understood that any increase in width resulting from covering material (W1-W2 in FIG. 12) depends on the thickness of covering material and may be adapted to requirements.

Figure 13:
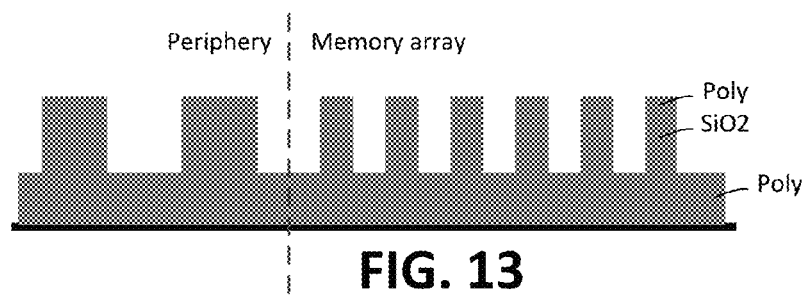
FIG. 13 shows the structure of FIG. 12 after removal of masking portions and covering material.

FIG. 13 shows the structure of FIG. 12 after removal of the masking portions 830a-h and covering material. Once the pattern formed by the masking portions is used to pattern underlying layer(s) the masking portions themselves and covering material may be removed (e.g. by wet etch or otherwise) leaving the patterned layer below. This pattern may then be transferred to lower layers or may be used directly. For example the patterned layers of FIG. 13 include a masking layer formed of silicon dioxide which may be used to pattern an underlying layer of polysilicon into individual word lines and other structures. The result is that some conductive lines such as word lines may be formed with very small dimensions while (e.g. W2) other conductive lines (or portions of the same conductive lines) may be formed with larger dimensions (e.g. W1) using the same process.

Figure 14:
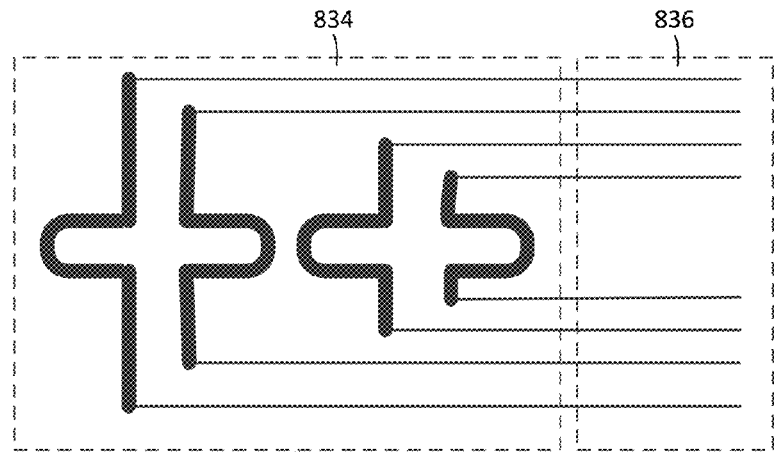
FIG. 14 shows an example of conductive lines with wider portions formed using covering material.

FIG. 14 shows a plan view of a portion of a peripheral area 834 of a memory that includes both wider and narrower conductive portions (this view corresponds to a portion of FIG. 5). In particular, word lines are formed to have very small widths in the memory array area 836 where they are closely spaced. Where lines become more isolated in the peripheral area 834 they are made wider so that they are less likely to be deformed or to collapse. This also provides reduced resistance along such conductive lines in peripheral area 834.

Pads and Select Gates

While the process described above is applicable to isolated masking portions, which may be susceptible to physical damage, aspects are applicable to other structures, including larger structures such as contact pads and select gates. In addition to using a covering material to widen and strengthen an isolated masking portion, a covering material may be used to define a relatively large masking portion from a collection of smaller masking portions (e.g. masking portions formed as sidewalls). In general, sidewalls have defined widths which make them unsuitable for defining large structures. However, a group of closely spaced sidewalls may have covering material applied to fill spaces and thereby join isolated sidewalls together into a single large masking portion. This allows the same mask pattern, such as a sidewall pattern, to be used to define very small features (e.g. word lines in a memory array area) and, with covering material, to define much larger features (e.g. contact pads and select gates).

Figure 15:
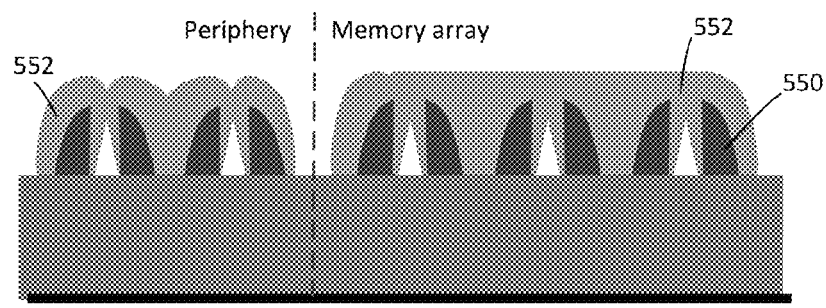
FIG. 15 shows a cross section of a memory at an intermediate stage of fabrication.

FIG. 15 is a cross sectional view of a memory that includes a memory array area where word lines are to be formed and an area where a larger structure is to be formed. The larger structure may be a contact pad in a peripheral area, a select gate, or may be some other relatively large scale structure such as a peripheral transistor or other peripheral device. Elongated masking portions 550 are formed with fine spacing in the memory array area as before. In this example, masking portions are also formed with fine spacing where the large structure is to be formed. In the cross section shown, covering material 552 has been deposited and etched back to form a substantially continuous covering over masking portions 550 of the memory array and a separate continuous covering over the finely spaced masking portions 550 where the large structure is to be formed. Between these areas there are some areas where covering material is removed over the field (i.e. where etching back of covering material 552 exposes the underlying layer).

Figure 16:
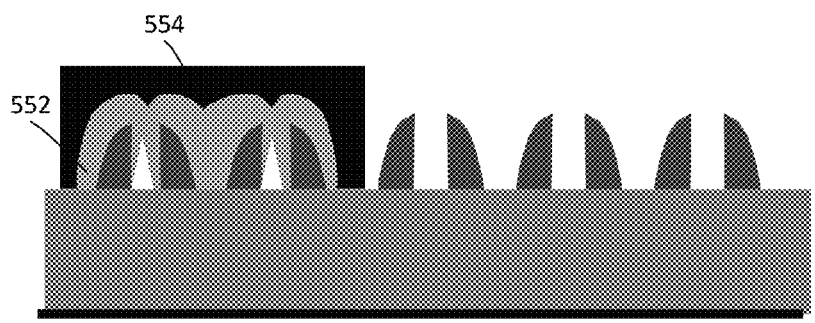
FIG. 16 shows the structure of FIG. 15 after removal of covering material from a word line area.

FIG. 16 shows the structures of FIG. 15 after photoresist is applied and patterned to form a resist portion 554 to protect the large scale structure during removal of covering material 552 from the memory array. The location of resist portion 554 does not have to be very precise because the edges of the large structure are defined by the covering material 552 on masking portions 550.

Figure 17:
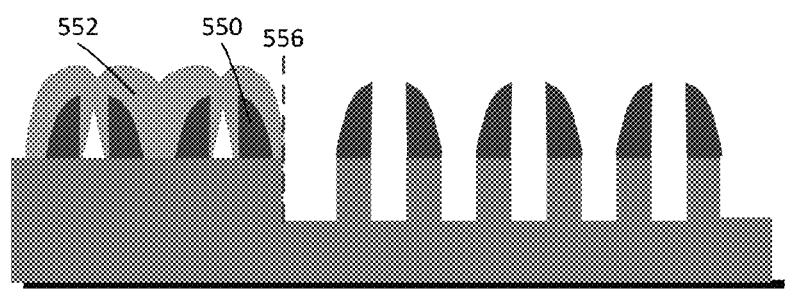
FIG. 17 shows the structure of FIG. 16 after pattern transfer.

FIG. 17 shows the result of anisotropic etching with the covering material in place to define a large scale structure. It can be seen that the location of edge 556 is established by covering material 552 which is located along a side of a masking portion 550 and is thus established by the same pattern of elongated masking portions that define word lines. The location of edge 556 does not depend on precise alignment of the resist portion used to mask covering material. Formation of word lines in the memory array area is as previously described (no covering material). Covering material joins together the elongated masking portions to define a single continuous area corresponding to a large scale structure and this pattern is transferred to the underlying layer or layers.

Figure 18:
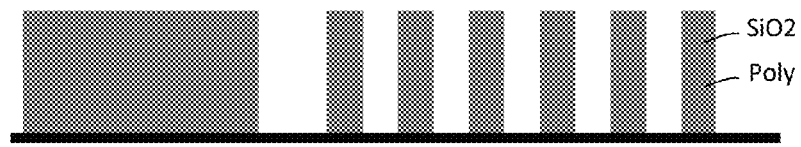
FIG. 18 shows the structure of FIG. 17 after removal of masking portions and covering material and further pattern transfer.

FIG. 18 shows the structure of FIG. 17 after removal of the elongated masking portions and the covering material. Also, the pattern has been transferred to a lower layer in this view. For example, the upper layer is a masking layer of silicon dioxide while the lower layer is polysilicon in this example. The large scale structure thus formed of polysilicon may be a select line, a contact pad, a peripheral transistor, or other structure.

Figures 19A, 20A, 21A:
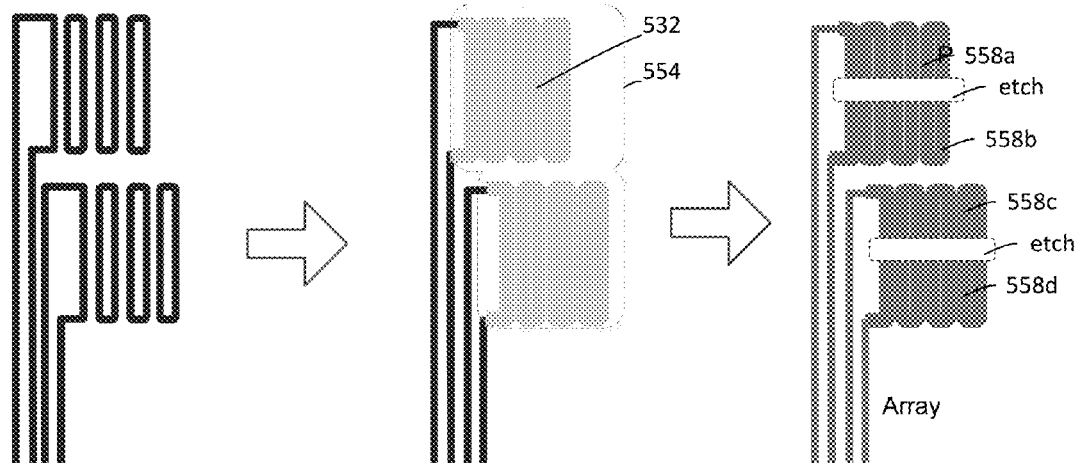
FIGS. 19A-19B show a contact pad area and a memory array area respectively at an intermediate stage of fabrication in plan view.
FIGS. 20A-20B show the structures of FIGS. 19A-19B respectively after formation and selective removal of covering material.
FIGS. 21A-21B show the structures of FIGS. 20A-20B respectively after pattern transfer, mask removal, and subsequent patterning and etching to separate pads and select lines.
Figures 19B, 20B, 21B:
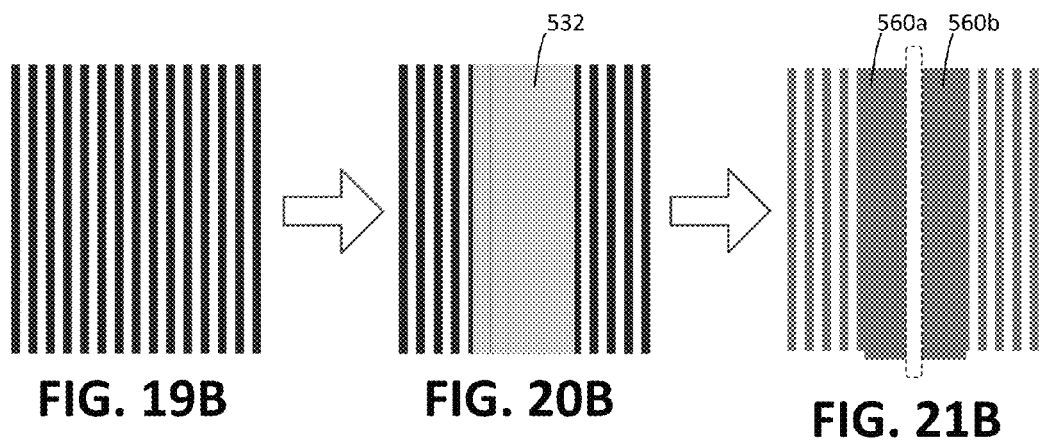

FIGS. 19-21 show formation of large scale structures in plan view. FIG. 19A shows elongated masking portions including closely spaced masking portions where a contact pad is to be formed. Closely spaced closed loops of masking portions define pad areas. These closed loops may be formed as sidewalls along sides of mandrels, which are formed by photolithographic patterning (and slimming where appropriate). FIG. 19B shows a portion of the memory array at the same stage of fabrication with closely spaced elongated masking portions extending in parallel where word lines and select lines are to be formed.

FIG. 20A shows the area of FIG. 19A after deposition and etch back of a covering material 532 followed by patterning and removal of the covering material from exposed areas. Covering material remains in place where contact pads are to be formed as shown by the outline of resist portion 554. FIG. 20B shows the memory array area of FIG. 20A at the same stage of fabrication as in FIG. 20A with covering material remaining 532 where select gates are to be formed, while covering material is removed from areas where word lines are to be formed.

FIG. 21A shows the contact pad area of FIG. 20A after patterning of a lower layer or layers according to the pattern of FIG. 20A and subsequent etching to form separate pads 558a-d. FIG. 21B shows the memory array area at the same stage of fabrication as FIG. 21A. The area defined by the covering material masked a relatively large area which is divided into two select gates 560a-b by an etch. The select gates are wider than the word lines.

Figure 22:
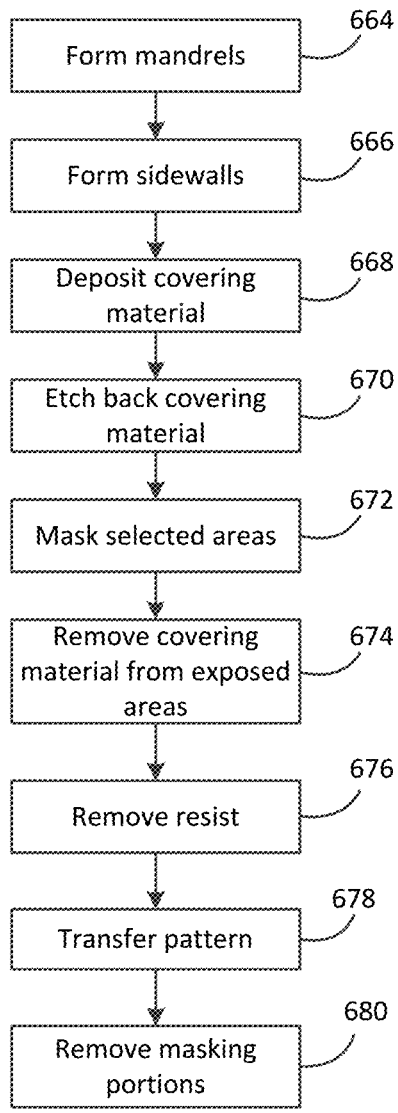
FIG. 22 illustrates an example of process steps to form large and small features.

FIG. 22 illustrates an example of some process steps that provide larger and smaller structures. Mandrels are formed 664 by a photolithographic process and may be thinned as required to achieve smaller sizes than achievable by direct patterning. Then, sidewalls are formed 666 along sides of the mandrels and the mandrels are removed. Subsequently, a covering material is deposited 668 to cover the substrate and is etched back by anisotropic etching to remove the covering material from areas without masking portions 670. A patterning step then masks selected areas 672 with photoresist, including, for example, contact pad areas, select gate areas, certain conductive lines in peripheral areas, peripheral transistors, or other structures. The covering material is then removed from the exposed (unmasked) areas 674 such as the memory array so that word line patterning is unaffected by the covering material. The photoresist is then removed 676 and the resulting pattern of small masking portions (without covering material) and large masking portions (with covering material) is transferred 678 to one or more underlying layers. The masking portions and covering material are then removed 680.

Materials

Various materials may be used to implement aspects of the processes described. The choices concerning materials may vary depending on a range of requirements and it will be understood that a suitable process may be practiced with any suitable materials. For example, the choice of covering material may depend on the materials used for elongated masking portions and for the underlying layers which may be determined by some other process requirements. A compatible covering material may be chosen so that covering material overlying the elongated masking portions and the underlying layer may be removed by a selective etch. Examples of materials are described here but will be understood to be merely illustrative of possible materials and not an exhaustive list of all possible materials.

Figure 23:
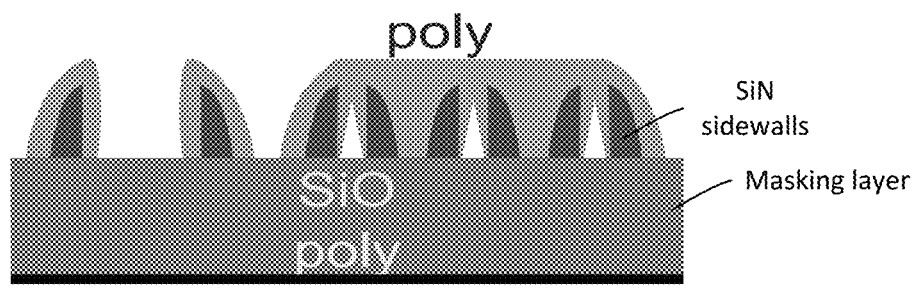
FIG. 23 illustrates an example of some materials that may be used.

FIG. 23 shows an example where a silicon dioxide masking layer overlies a polysilicon layer ("poly") that is used to form word lines. The elongated masking portions (sidewalls) are formed of silicon nitride (SiN) in this example. The covering material in this example is polysilicon which may be removed using an etch that is selective to polysilicon (i.e. etches polysilicon at a much higher rate than silicon nitride or silicon dioxide). An example of such an etch is Tetramethylammonium hydroxide (TMAH).

Figure 24:
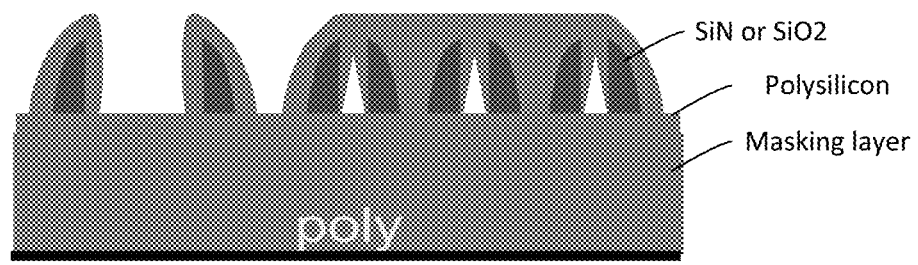
FIG. 24 illustrates another example of materials that may be used.

FIG. 24 shows another example in which there are two layers overlying the word line polysilicon layer. The upper layer is polysilicon and the lower layer is a masking layer such as silicon dioxide or carbon. Sidewalls in this example may be formed of silicon nitride or silicon dioxide. Where sidewalls are formed of silicon nitride, a suitable covering material may be a material that can be selectively removed without damaging silicon nitride or polysilicon. Examples of such materials include silicon dioxide (SiO2), silicon oxynitride (SiON), silicon carbon nitride (SiCN), silicon oxycarbide (SiOC), boron silicate glass (BSG), phosphorous silicate glass (PSG), boron phosphorous silicate glass (BPSG), amorphous carbon (a-C), aluminum oxide (Al2O3). A suitable etch may be used to remove such covering materials. For example, silicon dioxide may be removed using dilute hydrofluoric acid (HF: H2O) or buffered hydrofluoric acid (NH4F: HF: H2O). BSG or BPSG may be removed using HF vapor. Amorphous carbon may be removed using plasma etching with hydrogen and/or oxygen. Aluminum oxide may be removed using phosphoric acid solution (H3PO4: HNO3) or hydrogen peroxide solution (H2O2). A covering layer may be a compound layer that is formed of multiple layers with each individual layer formed of a different material, for example two or more of the materials listed here. These covering materials may be removed using a suitable etch chemistry such as one or more of the above described etches. Where sidewalls are formed of silicon dioxide, a suitable covering material may be a material that can be selectively removed without damaging silicon dioxide or polysilicon, for example silicon nitride. Silicon nitride may be selectively removed using a suitable etch such as hot phosphoric acid solution (H3PO4: HNO3).

Conclusion

Although the various aspects have been described with respect to exemplary embodiments, it will be understood that protection within the full scope of the appended claims is appropriate.

It is claimed:

1. A method of forming a NAND flash memory comprising:
   forming a plurality of elongated masking portions extending across an array area and a peripheral area of a memory die;
   subsequently depositing a covering material on the plurality of elongated masking portions;
   subsequently etching back the covering material;
   subsequently forming a protective portion over the plurality of elongated masking portions with covering material in the peripheral area while leaving elongated masking portions with covering material exposed in the array area;
   subsequently removing exposed covering material from the array area while the protective portion protects covering material in the peripheral area;
   subsequently removing the protective portion; and
   subsequently performing a patterning step using a pattern formed by the plurality of elongated masking portions without covering material to define word lines of a first width in the array area and using a pattern formed by the plurality of elongated masking portions with covering material to define one or more conductive lines that connect contact pads and word lines in the peripheral area, an individual conductive line having a second width that is greater than the first width.

2. The method of claim 1 wherein the elongated masking portions with covering material in the peripheral area additionally define a contact pad.

3. The method of claim 1 wherein the elongated masking portions with covering material in the peripheral area define at least one dimension of a peripheral transistor.

4. The method of claim 1 wherein forming the plurality of elongated masking portions comprises:
   forming a plurality of elongated mandrels by photolithographic patterning;
   subsequently narrowing the plurality of elongated mandrels; and
   subsequently forming the plurality of elongated masking portions as sidewalls along sides of the plurality of elongated mandrels.

5. The method of claim 1 wherein the covering material comprises at least one of: silicon dioxide (SiO2), silicon nitride (SiN), silicon oxy-nitride (SiON), silicon carbon nitride (SiCN), silicon oxy-carbide (SiOC), boron silicate glass (BSG), phosphorous silicate glass (PSG), boron phosphorous silicate glass (BPSG), and amorphous carbon (a-C), aluminum oxide (Al2O3).

6. The method of claim 1 further comprising forming an additional protective portion in the array area to protect covering material in a portion of the array area that defines one or more select transistors.

7. A method of forming a NAND flash memory comprising:
   forming a plurality of elongated masking portions extending across an array area and a peripheral area of a memory die;
   subsequently depositing a covering material on the plurality of elongated masking portions;
   subsequently etching back the covering material;
   subsequently forming a protective portion over the plurality of elongated masking portions with covering material in the peripheral area while leaving elongated masking portions with covering material exposed in the array area;
   subsequently removing exposed covering material from the array area while the protective portion protects covering material in the peripheral area;
   subsequently removing the protective portion; and
   subsequently performing a patterning step using a pattern formed by the plurality of elongated masking portions without covering material to define word lines of a first width in the array area and using a pattern formed by the plurality of elongated masking portions with covering material to define at least one of a contact pad or a conductive line that connects a contact pad with a word line in the peripheral area, the contact pad having a second width that is greater than the first width.

8. The method of claim 7 wherein the elongated masking portions with covering material in the peripheral area additionally define at least one dimension of a peripheral transistor.

9. The method of claim 7 wherein forming the plurality of elongated masking portions comprises:
   forming a plurality of elongated mandrels by photolithographic patterning;
   subsequently narrowing the plurality of elongated mandrels; and
   subsequently forming the plurality of elongated masking portions as sidewalls along sides of the plurality of elongated mandrels.

10. The method of claim 7 wherein the covering material comprises at least one of: silicon dioxide (SiO2), silicon nitride (SiN), silicon oxy-nitride (SiON), silicon carbon nitride (SiCN), silicon oxy-carbide (SiOC), boron silicate glass (BSG), phosphorous silicate glass (PSG), boron phosphorous silicate glass (BPSG), and amorphous carbon (a-C), aluminum oxide (Al2O3).

11. The method of claim 7 further comprising forming an additional protective portion in the array area to protect covering material in a portion of the array area that defines one or more select transistors.

* * * * *